United States Patent
Wood

(10) Patent No.: US 7,243,423 B2
(45) Date of Patent: Jul. 17, 2007

(54) CHIP PACKAGE WITH DEGASSING HOLES

(75) Inventor: Dustin P. Wood, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 224 days.

(21) Appl. No.: 11/000,255

(22) Filed: Nov. 30, 2004

(65) Prior Publication Data

US 2005/0077077 A1    Apr. 14, 2005

Related U.S. Application Data

(60) Division of application No. 09/800,703, filed on Mar. 7, 2001, now Pat. No. 6,831,233, which is a continuation of application No. 09/388,768, filed on Sep. 2, 1999, now Pat. No. 6,225,687.

(51) Int. Cl.
    *H01R 43/00* (2006.01)
(52) U.S. Cl. ...................................................... 29/846
(58) Field of Classification Search .................. None
    See application file for complete search history.

(56) References Cited

U.S. PATENT DOCUMENTS

| | | | | |
|---|---|---|---|---|
| 3,612,744 A | * | 10/1971 | Thomas | 174/36 |
| 3,634,782 A | * | 1/1972 | Marshall | 333/1 |
| 3,700,825 A | * | 10/1972 | Taplin et al. | 174/36 |
| 4,524,239 A | * | 6/1985 | Rouge | 174/254 |
| 4,560,962 A | * | 12/1985 | Barrow | 333/1 |
| 4,644,092 A | * | 2/1987 | Gentry | 174/36 |
| 4,855,537 A | * | 8/1989 | Nakai et al. | 174/250 |
| 4,859,806 A | | 8/1989 | Smith | |
| 5,300,899 A | * | 4/1994 | Suski | 333/1 |
| 5,334,800 A | * | 8/1994 | Kenney | 174/250 |
| 5,360,949 A | * | 11/1994 | Duxbury | 174/250 |
| 5,410,107 A | | 4/1995 | Schaper | |
| 5,479,138 A | * | 12/1995 | Kuroda et al. | 333/1 |
| 5,519,176 A | | 5/1996 | Goodman et al. | |
| 5,562,498 A | * | 10/1996 | Brandenburg et al. | 439/620.09 |
| 5,637,834 A | * | 6/1997 | La Bate et al. | 174/264 |
| 5,675,299 A | * | 10/1997 | Suski | 333/1 |
| 5,682,124 A | * | 10/1997 | Suski | 333/1 |

(Continued)

FOREIGN PATENT DOCUMENTS

WO    WO 9418812 A1 *  8/1994

*Primary Examiner*—David E. Graybill
(74) *Attorney, Agent, or Firm*—Schwegman, Lundberg, Woessner & Kluth, P.A.

(57) ABSTRACT

A semiconductor device package includes multiple built-up layers of metal sandwiching non-conductive layers. The metal layers have grids of degassing holes arranged in rows and columns. The rows and columns are locatable via a first coordinate system. Signal traces are embedded within the non-conductive layers such that the signal traces are also sandwiched between the metal layers with degassing holes. The signal traces generally run at zero degrees, 45 degrees, and 90 degrees relative to a second coordinate system. The first coordinate system is rotated relative to the second coordinate system to lower impedance variations of different traces. Impedance variations decrease due to the decreased variation in the number of degassing holes passed over or under by a trace. The grid of degassing holes on one metal layer can be offset in two dimensions relative to the degassing holes on another layer.

7 Claims, 4 Drawing Sheets

U.S. PATENT DOCUMENTS

| | | |
|---|---|---|
| 5,942,849 A * | 8/1999 | Cade .......................... 313/495 |
| 6,045,927 A | 4/2000 | Nakanishi et al. |
| 6,081,035 A * | 6/2000 | Warner et al. .............. 257/773 |
| 6,184,477 B1 * | 2/2001 | Tanahashi ................... 174/261 |
| 6,225,687 B1 | 5/2001 | Wood |
| 6,236,302 B1 * | 5/2001 | Barrett et al. ............. 338/22 R |
| 6,255,600 B1 | 7/2001 | Schaper |
| 6,303,871 B1 * | 10/2001 | Zu et al. ..................... 174/250 |
| 6,392,301 B1 | 5/2002 | Waizman et al. |
| 6,559,377 B1 * | 5/2003 | Noda et al. ................... 174/36 |
| 2001/0008313 A1 | 7/2001 | Wood |
| 2001/0052829 A1 | 12/2001 | Dabral et al. |
| 2002/0003049 A1 | 1/2002 | Dabral et al. |

\* cited by examiner

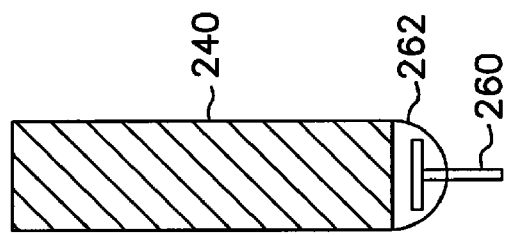
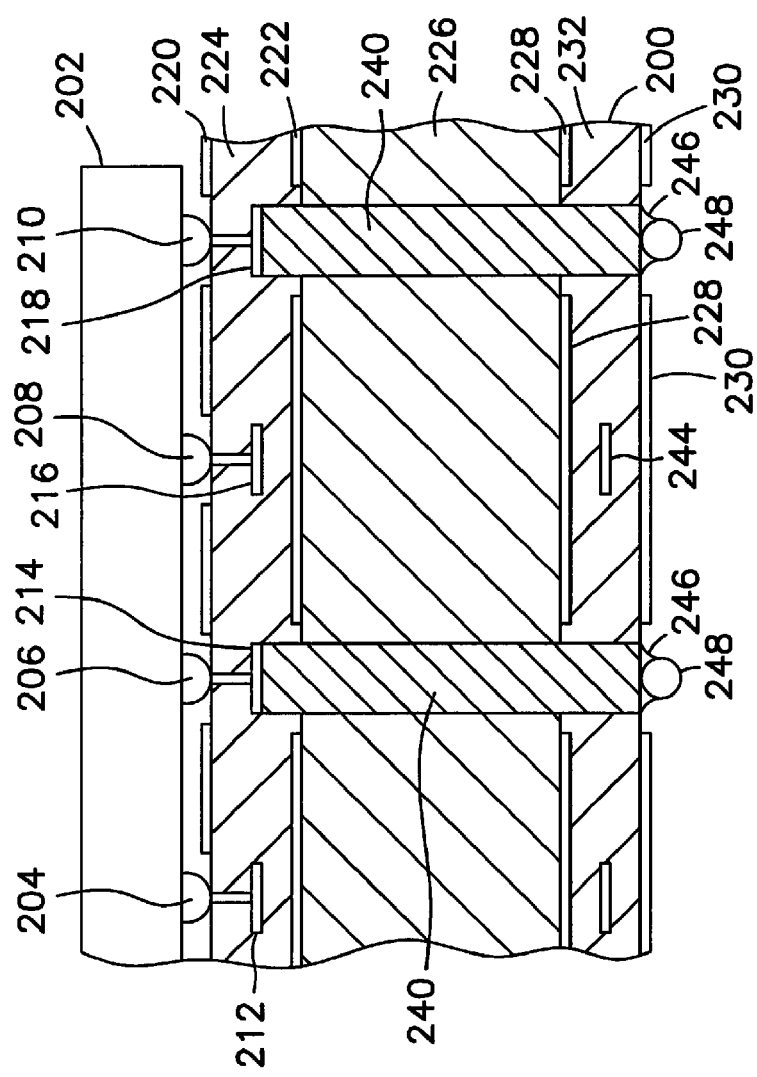

CHIP PACKAGE WITH DEGASSING HOLES

RELATED APPLICATION(S)

This application is a divisional of U.S. application Ser. No. 09/800,703 filed Mar. 7, 2001 now U.S. Pat. No. 6,831,233 which is a Continuation of U.S. application Ser. No. 09/388,768 filed Sep. 2, 1999 now issued at U.S. Pat. No. 6,225,687. These application are incorporated herein by reference.

FIELD

The present invention relates generally to computer board and chip packaging, and more specifically to chip package design and manufacturing.

BACKGROUND

As input/output (I/O) speed and the total number of I/Os required for high performance semiconductor chips have increased dramatically, the need for increased numbers of interconnect lines with low line impedance variation in chip packages has increased as well. To address this need, manufacturers have used multi-layered packages where several layers of conductors are separated by layers of dielectric material.

In printed circuit board (PCB) and integrated circuit (IC) manufacture, often semiconductor dies are to be connected to a motherboard. Typically, a die is connected to a package, which is in turn connected to a motherboard. The motherboard typically receives multiple packages, thereby providing electrical connections between multiple semiconductor chips. One manner in which circuit dies can be mounted to a package is to "flip mount" the die to a small board designed to receive the die. When flip mounted, the die couples electrical signals to the package without the use of bond wires.

The package can have a core made of a common material such as glass epoxy, and can have additional layers laminated onto the core. These additional layers are also known as "built-up" layers. The built-up layers are typically formed from alternating layers of dielectric material and conductive material. Patterns may be built in the metal or conductive layer through various etching processes such as wet etching which are known in the art and will not be described further herein. Plated through holes called vias are used to make interconnects between various layers of metal. Using these layers and vias, several layers of interconnections may be built up.

Input/Output functions are typically accomplished using metal traces between the layers. Each trace has an impedance generated by its geometry and location on the package. Due to the manufacturing technology and material requirements, packages having built-up layers often include a number of degassing holes in the metal layers. Degassing holes allow gas to be evaporated during the manufacture of the package so that bubbles do not form in the package.

Traces may be routed over or under the degassing holes, or around the degassing holes, or a combination thereof. Since the traces are not in the same location on the package, and pass over varying amounts of non-metal areas caused by degassing holes in the metal layers, the traces have an impedance variation, or mismatch. A typical degassing hole pattern has a grid-like array of degassing holes aligned vertically between two layers, as is shown in FIG. 1. In FIG. 1, the degassing holes 102 of the top and bottom layers are exactly aligned in the x and y directions. When traces such as trace 1 and trace 2 are used with a degassing hole alignment scheme as shown in FIG. 1, trace 1 has less metal from the conductive layers both above and below the trace than trace 2, and an impedance variation between the traces results.

For the reasons stated above, and for other reasons stated below which will become apparent to those skilled in the art upon reading and understanding the present specification, there is a need in the art for a semiconductor package having reduced trace impedance variation.

SUMMARY

In one embodiment, a device package includes a first conductive layer having a first grid of holes therethrough, where the first grid of holes is locatable relative to a first coordinate system. The device package also includes a second conductive layer also having a grid of holes therethrough. The second conductive layer is parallel to the first conductive layer, and the second grid of holes is also locatable relative to the first coordinate system. The device package also includes a plurality of signal traces disposed between the conductive layers, where the plurality of signal traces is locatable relative to a second coordinate system. A rotation axis is defined substantially perpendicular to the conductive layers, and the first coordinate system is rotated about the rotation axis between zero and 45 degrees relative to the second coordinate system.

BRIEF DESCRIPTION OF THE DRAWINGS

FIG. 2A is a cross section of a semiconductor device and package;

FIG. 2B is an alternate embodiment of a portion of a contact point;

DESCRIPTION OF EMBODIMENTS

Figure 1:
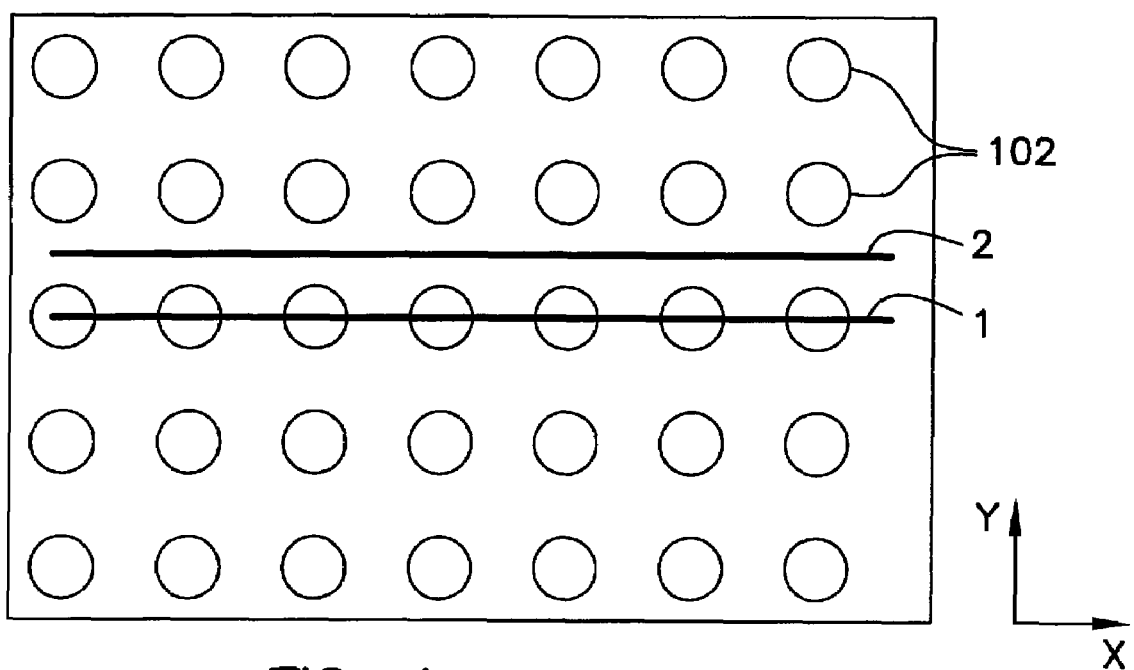
FIG. 1 is a top view of a prior art degassing hole configuration.

In the following detailed description of the embodiments, reference is made to the accompanying drawings which form a part hereof, and in which is shown by way of illustration specific embodiments in which the invention may be practiced. It is to be understood that other embodiments may be utilized and structural changes may be made without departing from the scope of the present invention.

FIG. 2A shows a cross-section of a semiconductor die and package in accordance with one embodiment of the invention. Semiconductor die 202 connects to package 200 at contact points 204, 206, 208, and 210. Signals from semiconductor die 202 propagate through vias 240 in package 200. Vias 240 are coupled to contact points 248. Contact points 248 are configured to be coupled to a motherboard, thereby completing the electrical connection from semiconductor die 202 to the motherboard. Package 200, or a portion thereof, forms a substrate to which semiconductor can be affixed. In one embodiment, package 200 is a substrate that is configured to receive a single semiconductor die, such as a microprocessor, and in another embodiment, package 200 is a substrate configured to receive multiple semiconductor die, such as in the case of a multi-chip module.

Package 200 includes core 226 and built-up layers on both sides of core 226. The built-up layers on top of core 226 include metal layer 222, dielectric layer 224, and metal layer 220. Traces 212 and 216 are also part of the built-up layers on top of core 226. Core 226 is a printed circuit board material, such as glass epoxy. In one embodiment core 226 is made of FR4 material. During manufacturing, metal layer 222 is deposited on core 226, and a portion of dielectric layer 224 is deposited on metal layer 222. A metal layer is then deposited on the dielectric, and is etched to create signal traces 212, 214, 216, and 218. The rest of dielectric layer 224 is then deposited, and then metal layer 220 is deposited. The result is a core material having built-up layers deposited thereupon, where the built-up layers include multiple metal layers and a dielectric layer. Embedded within the dielectric layer is a signal layer which carries signal traces. The embedded signal layers, and their orientation relative to the rest of the package is described in detail with reference to FIG. 3 and above.

Metal layers 222, 220, 228, and 230 have degassing apertures, or holes, therein. (Not shown in FIG. 2A). During manufacture, the dielectric material gives off a gas, and the degassing holes let the gas escape while keeping the built-up layers intact. The degassing holes, and their orientation relative to the rest of the package is described in detail with reference to FIG. 3 and above.

The built-up layers shown on the bottom of core 226 in FIG. 2A include metal layer 228, dielectric layer 232, trace 244, and metal layer 230. Vias 240 are shown protruding through the bottom built-up layers made up of layers to 228, 232, and 230. At the bottom end of vias 240 are contact points 248 and solder fillets 246. For ease of illustration, FIG. 2A shows vias 240 as traversing package 200 directly from contact points 206 and 210 to contact points 248. Other embodiments include vias that couple contact points 248 to traces within the upper built-up layers, such as trace 216. In another embodiment, at least one via emanates from a trace in the lower built-up layers, such as trace 244, such that the via does not traverse core 226.

The embodiment shown in FIG. 2A has a ball grid array (BGA) footprint. The BGA footprint is formed by an array of contact points 248 on the bottom of package 200. When package 200 has a BGA footprint, the motherboard typically has an array of pads, each of which is designed to receive one of contact points 248. In another embodiment, shown in FIG. 2B, via 240 terminates in pin 260 and solder fillet 262. When package 200 includes pin 260 on the end of via 240, the resulting package has a pin grid array (PGA) footprint. When package 200 has a PGA footprint, the motherboard typically has an array of plated holes, each of which is designed to receive one of pins 260.

Semiconductor die 202 can be any type of integrated circuit, including but not limited to, a microprocessor, digital signal processor, memory, memory controller, application-specific integrated circuit (ASIC), or the like. In the embodiment of FIG. 2, semiconductor die 202 is flip mounted such that electrically active regions of semiconductor die 202 make contact with contact points 204, 206, 208, and 210. Also, in another embodiment, a package as described above with respect to FIG. 2A can be mounted to a socket on a motherboard. Such a circuit package can also include a processor or other electronic components known to those of ordinary skill in the art.

In other embodiments, the package of the present invention can be used in such configurations as for chipset and processor packaging, and the like. For example, in one embodiment, the method and apparatus of the present invention is incorporated into Land Grid Array (LGA) packages and in Organic Land Grid Array Packages (OLGA). Any processor product using LGA or OLGA packaging technology is capable of implementing one of the embodiments of the present invention.

Figure 3:
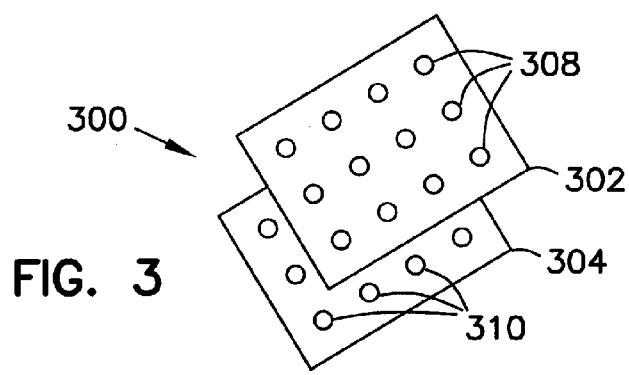
FIG. 3 is an isometric view of a degassing hole configuration according to one embodiment of the invention.

FIG. 3 shows a degassing hole configuration according to one embodiment 300 of the present invention. Embodiment 300 includes a package having at least two built-up layers of metal 302 and 304. Each of the metal layers 302 and 304 has therein a plurality of degassing apertures or holes 308 and 310, respectively. Metal layers 302 and 304 correspond to metal layers 220 and 222 (FIG. 2A) respectively. Degassing holes 308 are typically arranged in a grid pattern in metal layer 302, and degassing holes 310 are typically arranged in a grid pattern in metal layer 304. The grids have rows and columns, with the rows being in the x direction and the columns being in the y direction. Embodiment 300 includes grids of equally spaced holes. Degassing holes 308 and 310 are spaced equally in the x direction as well as in the y direction. In other embodiments, spacing of the holes in the grids is not equal in both the x and y directions. For example, in one embodiment, grid spacing is such that the distance between rows is twice the distance between columns. In another embodiment, the distance between columns is twice the distance between rows.

Degassing holes 302 and 310 are shown as round holes. Other shapes, such as squares and rectangles can be used without departing from the scope of the present invention. The distance between centers of degassing apertures in metal layers is referred to as "pitch." In one embodiment, the diameter of degassing holes 308 and 310 is 250 microns, and the pitch is 550 microns. This results in a grid of degassing holes 308 in metal layer 302 where each hole is spaced 550 microns from the nearest hole in both the x and y directions. This also results in a grid of degassing holes 310 in layer 304 where each hole is spaced 550 microns from the nearest hole in both the x and y directions. While a Cartesian coordinate system utilizing x and y are chosen, any coordinate system may be used without departing from the scope of the present invention.

Each degassing hole 308 or 310 has a position in x and y coordinates, as well as a z coordinate position. The z direction is best shown in FIG. 3. The z coordinate of all degassing holes on each layer is the same. The z coordinate of all degassing holes 308 on layer 302 is different from that of degassing holes 310 on layer 304, but the same for all degassing holes 308 on layer 302.

Figure 4:
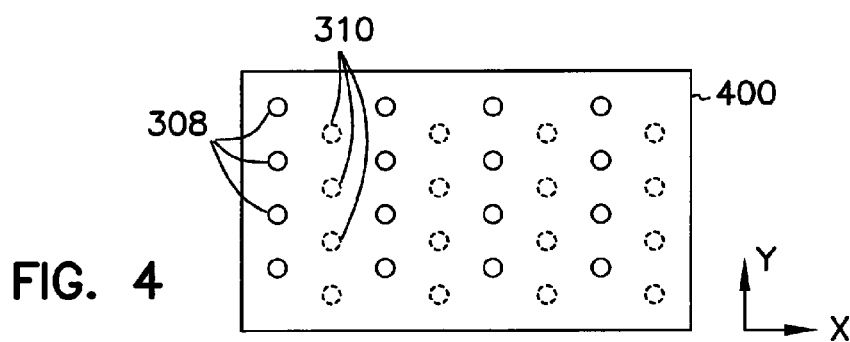
FIG. 4 is a top view of a degassing hole configuration according to one embodiment of the present invention.

FIG. 4 is a top view of a degassing hole configuration according to one embodiment of the present invention. Stacked layers 400 includes layers 302 and 304 stacked on top of each other. As may be seen from FIG. 4, layer 302 is offset from layer 304 in both the x direction and y direction such that the grid of degassing holes on layer 302 is interspersed with the grid of degassing holes on layer 304. In this embodiment, each degassing hole is adjacent in the x direction and in the y direction to a degassing hole on the same layer and having the same z coordinate. Each degassing hole also has adjacent degassing holes which do not lie in the x or y direction. These holes alternate z coordinates from layer 302 to layer 304. One skilled in the art will understand that many variations of offsets between layers 302 and 304 can exist while practicing the present invention. For example, the embodiment of FIG. 4 shows layer 302 offset from layer 304 an equal amount in both the x and y directions. In another embodiment, the offsets in the x and y direction are not equal. In the case of zero offsets, degassing holes 308 line up with degassing holes 310, such that when viewed from a point on the z axis, degassing holes 308 and degassing holes 310 appear in the same locations.

In an alternate embodiment, the degassing holes are arranged in a lattice pattern rather than a grid, with the degassing holes in layers 302 and 304 forming a lattice pattern having a lattice constant in one direction, and a second lattice constant in another, substantially perpendicular, direction. In this embodiment, the degassing hole lattice pattern has degassing holes alternating from layer 302 to layer 304 in both the x direction and the y direction. In other words, in the degassing hole lattice pattern as viewed from a point on the z axis, degassing holes 308 of layer 302 alternate with degassing holes 304 of layer 310 in both the x direction and the y direction. In one embodiment, the first lattice constant, that is the lattice constant in the x direction, has a pitch, or spacing, of twice the diameter of the degassing holes 308 and 310. In this embodiment, the second lattice constant, in the y direction, has a pitch equal to the diameter of the degassing holes 308 and 310. In another embodiment, the first lattice constant is 500 microns, and the second lattice constant is 250 microns. In this embodiment, the diameter of the degassing holes is 250 microns.

Figure 5:
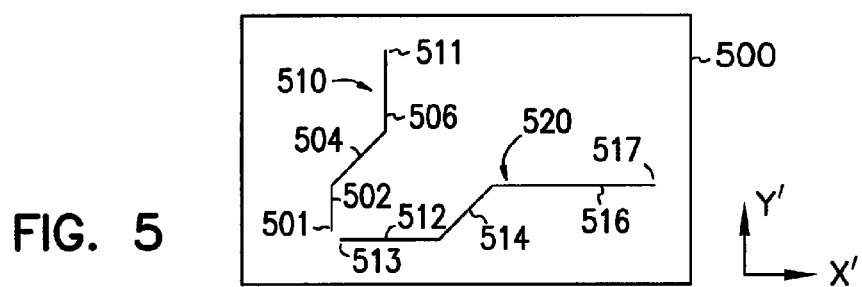
FIG. 5 is a top view of a signal layer according to one embodiment of the present invention.

FIG. 5 shows layer 500, which includes signal traces 510 and 520. Layer 500 corresponds to the layer embedded within the dielectric layer which is disposed between metal layers 302 and 304. Signal traces 510 and 520 are shown in FIG. 5 as being laid out in a coordinate system having an x_direction and a y_direction. Signal trace 510, which generally traverses layer 500 in the y_direction, includes trace segments 502, 504, and 506. Trace segment 502 traverses routing layer 500 in the y_direction which is perpendicular to the x_direction. Signal trace segment 506 similarly traverses routing layer 500 in the y_direction. Signal trace segment 504 connects trace segments 502 and 506, and traverses routing layer 500 at substantially 45 degrees to either the x_direction or the y_direction.

Signal trace 520 includes segments 512, 514, and 516. Signal trace 520 traverses routing layer 500 generally in the x_direction. Signal trace segments 512 and 516 traverse routing layer 500 in the x_direction. Signal trace segment 514, which connects signal trace segments 512 and 516, traverses routing layer 500 at an angle of substantially 45 degrees to either the x_direction or the y_direction. Signal traces 510 and 520 generally correspond to metal traces in the built-up layers, such as metal traces 212 and 216 (FIG. 2A).

Signal traces 510 and 520 are shown in FIG. 5 with endpoints 501, 511, 513, and 517. In general, one endpoint of each trace is connected to a semiconductor die, and the opposing end is connected to a contact point such as contact point 248 (FIG. 2A). In one embodiment, layer 500 is disposed beneath the semiconductor die such that endpoints 501 and 513 are coupled to a semiconductor die and endpoints 511 and 517 are connected to contact points. The routing of signal traces 510 and 520 occurs between metal layers that include degassing apertures, such as metal layers 302 and 304 (FIG. 3). As can be seen in FIG. 5, metal traces 510 and 520 route signals outward from the semiconductor die and connect signals to contact points such as contact points 248 (FIG. 2A), which in turn electrically connect the semiconductor die to the motherboard.

Two signal traces 510 and 520 are shown for ease of illustration. In practice, each I/O on the semiconductor die is assigned a metal trace on layer 500. This results in hundreds or even thousands of metal traces on layer 500. The actual number of traces can be more or less than the number of I/O on the semiconductor die depending on whether signal traces are shared, if a semiconductor I/O is fanned out to multiple places, or if multiple built-up layers exist such that multiple routing layers exist.

Figure 6:
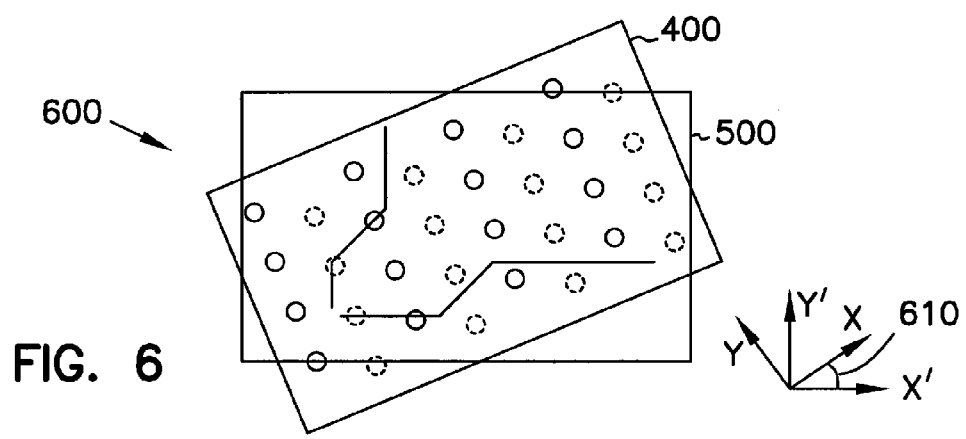
FIG. 6 is a top view of combined signal layer and metal layers in accordance with one embodiment of the present invention.

FIG. 6 shows embodiment 600 of the combination of layer 500 and stacked layers 400. Stacked layers 400 includes metal layers 302 and 304, between which routing layer 500 is disposed. Stacked layers 400 are rotated relative to layer 500 by an amount equal to angle 610. Angle 610 is shown as the rotation angle between the x direction and the x_direction along a rotation axis that is perpendicular to the planes in which layer 500 and stacked layers 400 reside. When angle 610 is zero degrees, signal traces on routing layer 500 generally run in the x direction, in the y direction, and at 45 degree angles. This orientation corresponds to signal traces running in the same direction as rows and columns of degassing holes, and at 45 degrees thereto. In this configuration, with angle 610 equal to zero degrees, some signal traces cross many degassing holes in stacked layers 400, and some signal traces cross no degassing holes in stacked layers 400. This results in impedance variations as previously described.

When angle 610 is between zero and 45 degrees, signal traces on layer 500 do not run in the same direction as rows and columns of degassing holes, and at 45 degrees thereto. As angle 610 moves away from zero degrees, signal traces on layer 500 which previously did not cross over degassing holes in stacked layers 400 start to cross over degassing holes. Likewise, signal traces that previously crossed over many degassing holes in stacked layers 400 start to cross over fewer degassing holes. As angle 610 becomes greater, the variation in the number of degassing holes crossed by any one signal trace becomes smaller. As a result, impedance variations decrease.

Simulation results suggest that when angle 610 is equal to substantially 22.5 degrees, impedance variations reach a minimum, at less than about one Ohm from trace to trace. As angle 610 increases beyond 22.5 degrees, and approaches 45 degrees, the results are the same as if angle 610 had been decreased from 22.5 degrees back to zero. Stated differently, impedance variation appears to be symmetric about 22.5 degrees when angle 610 is swept between zero degrees and 45 degrees. Simulation results also suggest that a trace routed generally in the x_direction will have no restrictions as to its y_coordinate. In other words, a trace routed in the x_direction could freely be moved up or down in terms of its y_coordinate position. As a result, traces may be routed with fewer concerns for exacting placement due to the degassing hole configuration of embodiment 600.

Rotation angles of between zero degrees and 45 degrees result in signal traces traversing the package at angles other than zero degrees, 45 degrees, and 90 degrees relative to the grid of degassing holes. For example, when signal traces run at angles of zero, 45 degrees, and 90 degrees relative to the x_direction, and when angle 610 is 10 degrees, signal traces run at minus 10 degrees, 35 degrees, and 80 degrees relative to the grid of degassing holes. One can see therefore, that when angle 610 is between zero degrees and 45 degrees, signal traces run at between zero and 45 degrees, 45 degrees and 90 degrees, zero and minus 45 degrees, and minus 45 degrees and minus 90 degrees.

Figure 7:
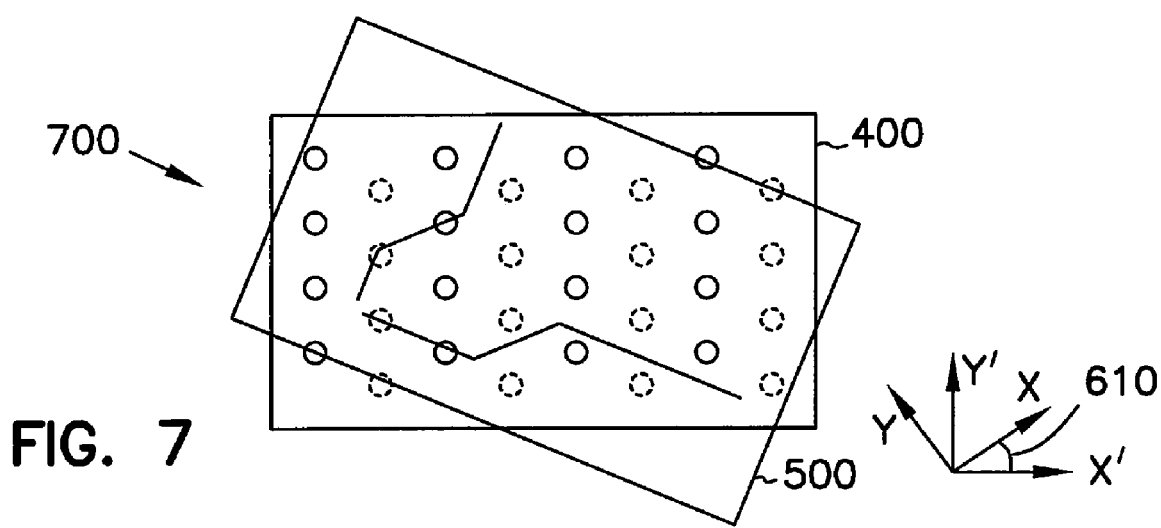
FIG. 7 is a 22.5 degree rotated view of the top view of the combined signal layer and metal layers of FIG. 6, consistent with an example embodiment of the invention.

The embodiment of FIG. 6 shows stacked layers 400 rotated counter clockwise less than 45 degrees. In another embodiment, stacked layers 400 are rotated beyond 45 degrees to an angle between 45 degrees and 90 degrees. In this embodiment, simulation results suggest impedance variations reach a minimum at substantially 67.5 degrees. The same results are achieved with rotations of the opposite direction. For example, impedance variations also reach a minimum at substantially −22.5 degrees and −67.5 degrees rotation. Additionally, layer 500 may be rotated rather than stacked layers 400 being rotated, as is shown in FIG. 7.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method of manufacturing built-up layers on a core comprising:
    depositing a first metal layer with a first grid of holes on a first side of the core;
    depositing a first dielectric layer on the first metal layer;
    depositing a first signal layer on the first dielectric layer;
    etching the first signal layer to produce at least one signal trace;
    depositing a second dielectric layer on the first dielectric layer and the at least one signal trace; and
    depositing a second metal layer with a second grid of holes on the second dielectric layer, such that the second grid of holes does not align with and do not overlap the first grid of holes.

2. The method of claim 1 wherein etching comprises:
    etching the first signal layer to produce at least one signal trace including segments parallel and 45 degrees to each other.

3. The method of claim 2 wherein the first grid of holes includes holes in an x direction and a y direction, and wherein etching comprises:
    etching the first signal layer to produce at least one signal trace including segments that are not parallel to either the x direction or the y direction.

4. The method of claim 1 wherein the first grid of holes includes holes in an x direction and a y direction, and wherein etching comprises:
    etching the first signal layer to produce at least one signal trace segment that is rotated substantially 22.5 degrees relative to the x direction.

5. The method of claim 4 wherein depositing a second metal layer comprises:
    depositing the second metal layer such that the second grid of holes is offset from the first grid of holes in either the x direction or the y direction.

6. The method of claim 4 wherein depositing a second metal layer comprises:
    depositing the second metal layer such that the second grid of holes is offset from the first grid of holes in at least one of the x direction and the y direction.

7. The method of claim 1 further comprising:
    depositing a third metal layer with a third grid of holes on a second side of the core;
    depositing a third dielectric layer on the third metal layer;
    depositing a second signal layer on the third dielectric layer;
    etching the second signal layer to produce at least one signal trace;
    depositing a fourth dielectric layer on the third dielectric layer and the at least one signal trace; and
    depositing a fourth metal layer with a fourth grid of holes on the fourth dielectric layer, such that the fourth grid of holes does not align with the third grid of holes.

* * * * *